(12) United States Patent
Demange (10) Patent No.: US 9,292,058 B2
(45) Date of Patent: Mar. 22, 2016

(54) HEAT SINK FOR PROCESSOR

(71) Applicant: BULL SAS, Les Clayes-Sous-Bois (FR)

(72) Inventor: Fabien Demange, Poissy (FR)

(73) Assignee: BULL SAS, Les Clayes-Sous-Bois (FR)

( * ) Notice: Subject to any disclaimer, the term of this patent is extended or adjusted under 35 U.S.C. 154(b) by 120 days.

(21) Appl. No.: 14/184,407

(22) Filed: Feb. 19, 2014

(65) Prior Publication Data

US 2014/0233174 A1   Aug. 21, 2014

(30) Foreign Application Priority Data

Feb. 20, 2013 (FR) ...................... 13 51436

(51) Int. Cl.
| | |
|---|---|
| *H05K 7/20* | (2006.01) |
| *G06F 1/20* | (2006.01) |
| *F28D 15/00* | (2006.01) |
| *F28G 1/00* | (2006.01) |
| *H01L 23/34* | (2006.01) |
| *F28D 15/02* | (2006.01) |

(52) U.S. Cl.
CPC .............. *G06F 1/20* (2013.01); *F28D 15/0241* (2013.01); *F28D 15/0275* (2013.01); *H05K 7/20218* (2013.01); *H05K 7/20772* (2013.01); *H05K 7/20809* (2013.01)

(58) Field of Classification Search
CPC ........ G06F 1/20; H05K 7/20; H05K 7/20336; H05K 7/20809; H05K 7/20772; H05K 7/20218; F28F 3/02; F28D 15/02; F28D 15/0241; F28D 15/0275
USPC ........................ 361/676–678, 679.46–679.54, 361/688–723, 831; 165/104.21, 177; 257/713, 14; 438/121, 122
See application file for complete search history.

(56) References Cited

U.S. PATENT DOCUMENTS

| | | | |
|---|---|---|---|
| 6,016,251 A | 1/2000 | Koide et al. | |
| 2002/0070444 A1 | 6/2002 | Turner | |
| 2004/0037045 A1* | 2/2004 | Phillips et al. | ................ 361/719 |
| 2006/0050483 A1* | 3/2006 | Wilson et al. | ................. 361/702 |
| 2007/0058347 A1* | 3/2007 | Tsai et al. | ..................... 361/703 |
| 2009/0056925 A1 | 3/2009 | Wang et al. | |

OTHER PUBLICATIONS

Search Report and Written Opinion as issued for French Patent Application No. 1351436, dated Nov. 6, 2013.

* cited by examiner

*Primary Examiner* — Courtney Smith
*Assistant Examiner* — Zhengfu Feng
(74) *Attorney, Agent, or Firm* — Pillsbury Winthrop Shaw Pittman LLP (57) ABSTRACT

A heat sink for a processor includes: a main heat exchange zone that bears in contact with a processor; at least one peripheral heat exchange zone that bears in contact with a cooling source, and at least one heat pipe connecting the main heat exchange zone with the peripheral heat exchange zone, the heat pipe containing a cooling fluid.

8 Claims, 5 Drawing Sheets

HEAT SINK FOR PROCESSOR

CROSS REFERENCES TO RELATED APPLICATIONS

This application claims priority to French Patent Application No. 1351436, filed Feb. 20, 2013, the entire content of which is incorporated herein by reference in its entirety.

FIELD

This invention relates to a heat sink for a processor and an electronic board on which such a heat sink is mounted. This invention also relates to a compute blade for a server that can be mounted on a rack fitted with such a heat sink.

BACKGROUND

Computing processors release heat and therefore have to be cooled. This is done using radiators fixed onto the processors. Radiators are fitted with fins through which cooling air is ventilated to cool the processors. However, these radiators are relatively large. Also, they can only be used in devices in which air circulation is significant (forced ventilation).

SUMMARY

An aspect of the invention is aimed at overcoming the disadvantages of the state of the art by disclosing a cooling system with improved cooling efficiency, including in the case there is little or even no air circulation.

Another aspect of the invention is to disclose a processor cooling system fixed onto a support that facilitates maintenance of the processor and in particular facilitates disassembly of the processor, for example in the case of a failure.

An aspect of the invention also discloses a compact processor cooling system.

In a first embodiment, the invention discloses a heat sink for a processor comprising:
- a main heat exchange zone capable of bearing in contact with a processor;
- at least one peripheral heat exchange zone capable of being in thermal contact with a cooling source,
- at least one heat pipe connecting the main heat exchange zone with the peripheral heat exchange zone, the heat pipe containing a cooling fluid.

More precisely, in an embodiment, the heat pipe is capable of heat transfer by a liquid/gas phase transition of the hermetically trapped cooling fluid.

This heat sink is very beneficial because it. is very compact. It is also capable of evacuating heat generated by the processor through the main heat exchange zone that collects heat generated by the processor. Heat collected by the main exchange zone is then forwarded to the peripheral heat exchange zone and therefore to the cold source through the heat pipe.

In this document, "bearing" means "applying pressure". The fact that a first part bears upon a second part means that it applies pressure on this second part. To achieve this, the first part may be in .contact with the second part, or there may be an element between them, and particularly a thermal interface.

The heat sink according to an embodiment of the invention may also comprise one or several of the technical characteristics disclosed below taken individually or in any technically possible combination.

In an embodiment, the main heat exchange zone comprises a bearing surface adapted to bear in contact with the processor. The bearing surface may be plane so as to improve thermal contact between the heat sink and the processor.

According to different embodiments, the heat sink may comprise a continuous peripheral heat exchange zone that extends around the main heat exchange zone, or it may comprise several peripheral heat exchange zones arranged around the main heat exchange zone. According to an embodiment, the heat sink comprises two peripheral heat exchange zones arranged on each side of the main heat exchange zone.

Beneficially, each peripheral heat exchange zone comprises a bearing surface able to bear in contact with a cold source. This bearing surface is plane. These bearing surfaces enable to improve evacuation of heat to the cold source.

In an embodiment; the heat sink comprises a main attachment device (broadly termed "fastener") able to fix the heat sink onto a support and to control the force applied by the main heat exchange zone on a processor inserted between this main heat exchange zone and the support. Thus, the heat sink not only cools the processor, but it also presses the processor against the support and particularly against a socket, located on the support so as to guarantee the connection of the processor to its socket.

According to a first embodiment, each peripheral heat exchange zone is fixed relative to the main heat exchange zone. In this case, each peripheral heat exchange zone and the main heat exchange zone are fixed onto a single non-deformable main body. The heat pipe then extends inside this main body, such that the heat pipe cannot be deformed. This embodiment has the benefit that it is an easily-made and robust heat sink.

According to a second embodiment, each peripheral heat exchange zone is free to move relative to the main heat exchange zone, the heat pipe being flexible. In this case, each peripheral heat exchange zone forms part of a peripheral body distinct from the main body to which the main heat exchange zone belongs. The peripheral body is connected to the main body through the flexible heat pipe. This embodiment can improve evacuation of heat because thermal contacts between the heat sink and the cold source and between the heat sink and the processor are improved.

Beneficially, the heat sink comprises secondary attachment device (broadly termed "fastener") capable of fixing each peripheral heat exchange zone to a cold source. Thus, each peripheral heat exchange zone can be fixed independently of the main heat exchange zone, which can improve thermal contact firstly between the processor and the main heat exchange zone and secondly between each peripheral heat exchange zone and the cold source. However, even if this embodiment can give improved heat exchanges, it is more complicated to make and is more fragile.

A second aspect of the invention relates to an electronic board comprising:
- A support;
- A processor;
- A cold source;
- A heat sink according to the first aspect of the invention, the processor being located between the heat sink and the support, the main heat exchange zone bearing on the processor, each peripheral heat exchange zone being thermally connected to the cold source.

The electronic board thus formed is particularly beneficial because the processor is easily accessible despite the presence of its cooling system formed by the heat sink. All that there is above the processor is the heat sink, which can easily be removed to enable access to the processor.

Beneficially, the main heat exchange zone is thermally connected to the processor through a thermal interface material. This thermal interface material may be a thermal grease. This thermal interface material guarantees thermal contact between the heat sink and the processor despite the presence of imperfections on the surface of the main heat exchange zone.

Beneficially, each peripheral heat exchange zone is thermally connected to the cold source through a thermal interface material. This thermal interface material may be a thermal conductive grease. This thermal interface material guarantees thermal contact between the cold source and each peripheral heat exchange zone despite the presence of imperfections on the surface of the peripheral heat exchange zone.

According to an embodiment, the heat sink is fixed onto the support by main attachment device such that the main heat exchange zone bears in contact with the processor applying a predetermined force on the processor. The predetermined force is chosen so as to:
- guarantee thermal contact between the main heat exchange zone and the processor despite thermal expansion of the components, and to
- guarantee electrical contact between the processor and its socket located between the support and the processor.

The cold source may comprise a cold plate. The cold plate may comprise at least one channel through which a cooling fluid can flow.

The cold plate may be parallel to the support.

The outside dimensions of the cold plate may approximately be the same as the support.

In an embodiment, the electronic board comprises electronic components other than the processor, these electronic components being fixed onto the support. The cold plate covers all electronic components fixed onto the support for which the height is less than the sum of:
- the distance between the cold plate and the support; and
- the thickness of the cold plate.

Therefore, the cold plate cools all electronic components that it covers, and the support.

In an embodiment, the cold plate comprises a through opening, and the processor passes through the through opening. Thus, the processor is accessible despite the presence of the cold plate. It is also cooled by the heat sink, and remains easily accessible.

Each peripheral heat exchange zone may be held against the cold plate.

Another aspect of the invention relates to a compute blade for a server and particularly for a server that can be mounted on a rack containing an electronic board according to the second aspect of the invention.

BRIEF DESCRIPTION OF THE FIGURES

Other characteristics and benefits of the invention will become clear after reading the following description with reference to the appended figures that show.

Identical or similar elements are identified by identical reference symbols on all figures.

DETAILED DESCRIPTION OF AT LEAST ONE EMBODIMENT

FIGS. 1 to 7 show a heat sink 1 according to an embodiment of the invention.

Figure 1:
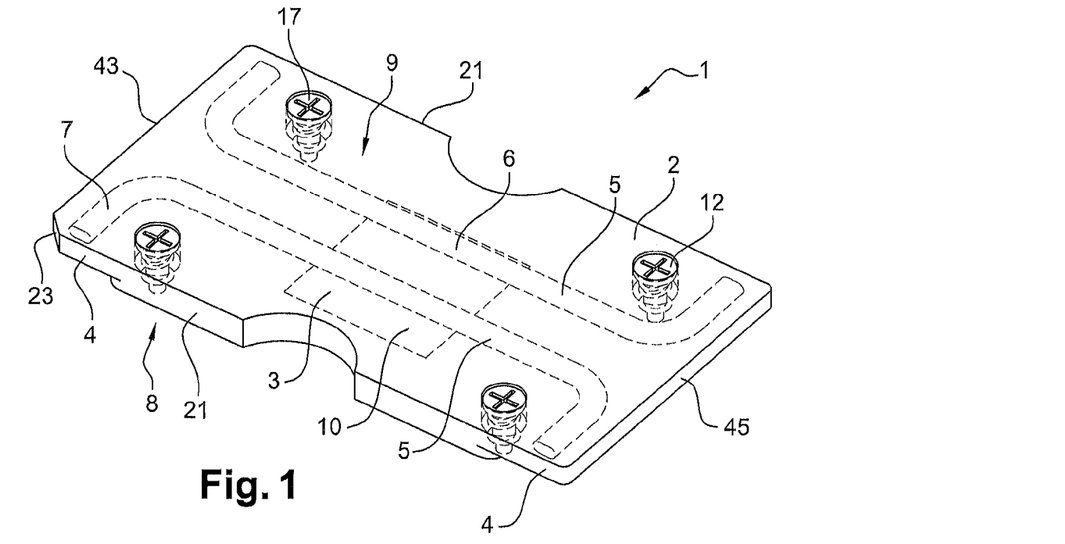
FIG. 1, a perspective view of a heat sink according to an embodiment of the invention.
Figure 2:
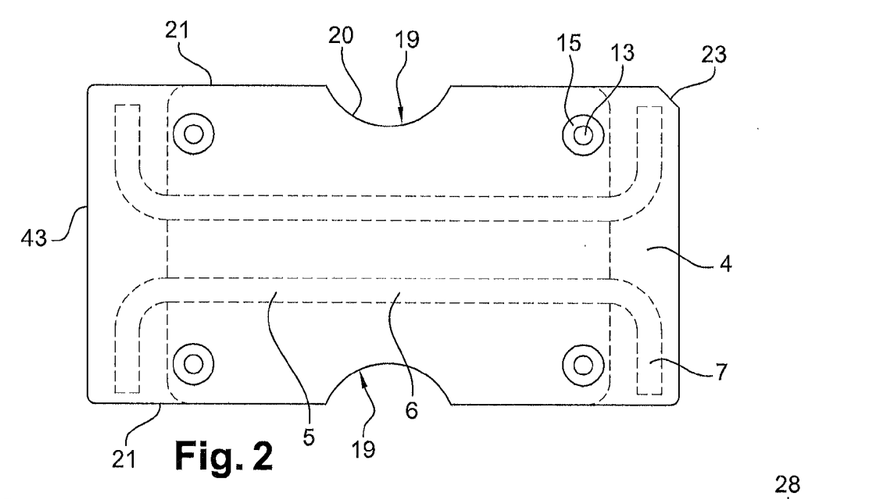
FIG. 2, a top view of the heat sink in FIG. 1.

The heat sink 1 comprises a main heat exchange zone 3 capable of bearing in contact with a processor to be cooled. The heat sink 1 also comprises two peripheral heat exchange zones 4 capable of coming into thermal contact with a cold source.

The main heat exchange zone 3 is connected to the peripheral heat exchange zones 4 through at least one heat pipe 5 and more precisely in this embodiment by two heat pipes 5. Each heat pipe 5 may be formed from a tube, made of copper, so as to optimise the heat transfer. In an embodiment, the main heat exchange zone 3 is located at the centre 6 of each heat pipe 5, while the peripheral heat exchange zones are at the ends 7 of each heat pipe. Each heat pipe 5 contains a cooling fluid. This cooling fluid is in the liquid state at ambient temperature and is transformed into a gas when the processor releases heat so as to improve heat transport through the heat pipe.

In this embodiment, the heat sink 1 comprises a main body 2 formed from a metallic plate. The metallic plate is made from a heat conducting material. This material may for example be made of aluminium, but it might also be possible to envisage making the metallic plate from copper. The main body 2 comprises a lower surface 8 that will face the processor to be cooled, and an upper surface 9 that is the surface of the main body that extends parallel to the lower surface 8.

In this embodiment, the main heat exchange zone 3 is formed:
- Either directly by a part of the lower surface 8 of the main body 2 and by the part of each heat pipe 5 that extends through said part; this case is beneficial because the heat pipes are as close as possible to the processor to be cooled which can optimise its cooling;
- Or, as shown in FIG. 1, by an add-on plate 10 fixed onto the lower surface 8 of the main body 2. This add-on plate 10 is made from a heat conducting material, for example copper. This add-on plate 10 is thin, for example of the order of 1 mm, to optimise heat exchanges. In this case, the main heat exchange zone 3 is formed by a plane bearing surface, so as to improve thermal contact between the heat sink and the processor to be cooled.

In an embodiment, the main heat exchange zone 3 is located approximately at the centre of the main body 2.

In an embodiment, the peripheral heat exchange zones 4 are located on each side of the main heat exchange zone 3.

Figure 7:
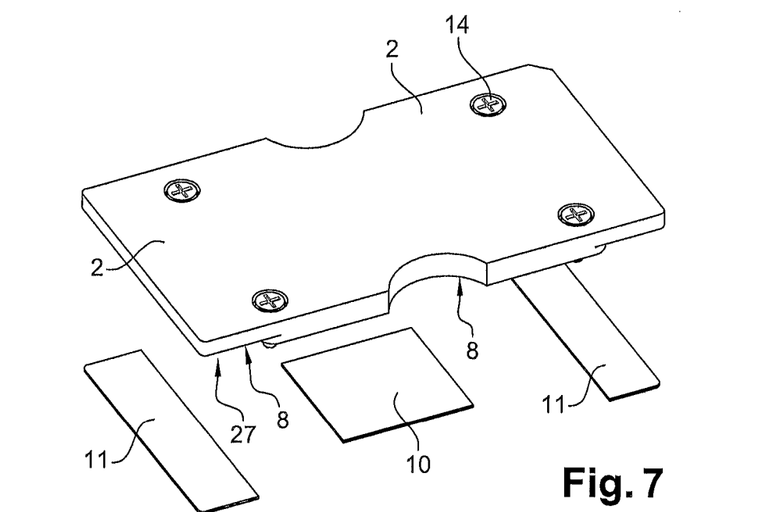

In this embodiment, each peripheral heat exchange zone 4 is formed:
- Either directly by a part of the lower surface 8 of the main body 2 and by the part of each heat pipe 5 located on it, which as explained above can optimise heat exchanges in that the heat pipes can be as close as possible to the cold source;
- Or as shown in FIG. 7, by an add-on plate 11 fixed on the lower surface 8 of the main body 2. This add-on plate 11 is made from a heat conducting material, for example copper. This add-on plate 11 has for example a small thickness of the order of 1 mm, to optimise heat exchanges. In this case, the add-on plate 11 may be plane, so as to improve thermal contact between peripheral heat exchange zones and the cold source.

The ends 7 of the heat pipes 5 extend above each peripheral heat exchange zone 4 so as to improve heat transfer between the heat pipes 5 and the peripheral heat exchange zones 4.

The heat sink 1 also comprises a main attachment device 12 for fixing the heat sink to a support.

Figure 4:
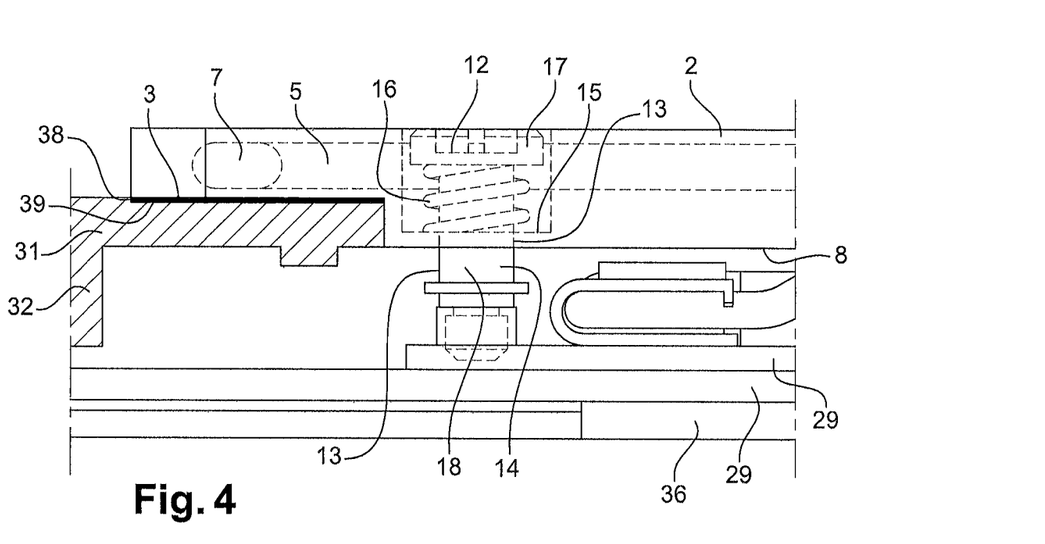
FIG. 4, an enlarged view of the main attachment device of the heat sink in FIG. 1.

The main attachment device 12 can also control the force applied by the main heat exchange zone on a processor inserted between this zone and the support. This force may be between 250 and 350 N.

This is achieved by assuring that the main attachment device 12 comprises at least:
- A through orifice 13 formed in the main body 2, the orifice being surrounded by a rim 15;
- A screw 14 inserted into the orifice 13, the screw comprising a screw head 17 and a screw body 18;
- A spring 16 compressed between the screw head 17 and the rim 15. Compression of the spring 16 provides a means of choosing the force applied by the main heat exchange zone onto the processor inserted between this zone and the support.

Furthermore, the heat sink 1 comprises a gripping arrangement or device 19 capable of gripping the heat sink. The gripping arrangement 19 may be formed by a cutout 20 made on each lateral side 21 of the main body 2. The dimensions of each cutout 20 are such that an average user can insert a finger in the cutout 20.

It would be possible to have a main body 2 with a rectangular cross-section to optimise its fabrication, but it would also be possible to have a main body 2 with a trapezoidal cross-section so as to optimise the space available for the heat sink. In the case in which one of the lateral sides 21 of the main body 2 is longer than the other, or more generally in the case in which the heat sink is not completely symmetrical, the heat sink comprises at least an orientation device capable of informing an operator of the direction in which the heat sink should be placed on an electronic board. This mark consists of a bevelled corner 23 of the main body 2, unlike the other corners that are not bevelled. More generally, any mark could be made on one corner of the main body 2 while the other corners of the main body do not have this mark, or vice versa.

Figure 6:
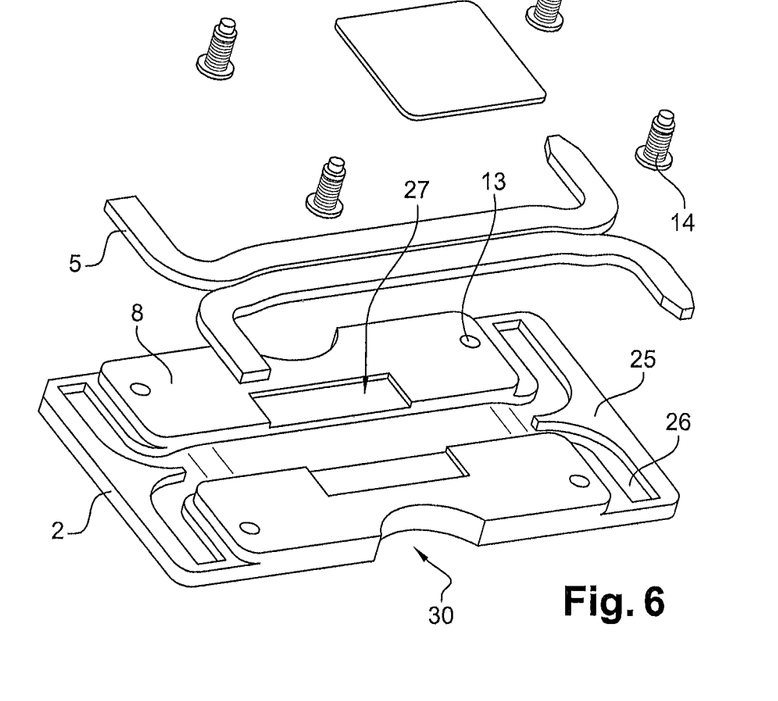
FIGS. 6 and 7, perspective views showing the steps of a method of manufacturing the heat sink in FIG. 1.

A method of fabricating a heat sink 1 according to an embodiment of the invention will now be described with reference to FIGS. 6 and 7. The main body 2 is firstly made from a metallic plate 25. The heat pipes 5 are then fixed to the main body 2. To achieve this, the heat pipes may for example be assembled to the main body 2 using a die casting method. Grooves 26 can also be machined in the metal plate 25, the heat pipes 5 then being inserted into these grooves 26. Furthermore, the heat pipes 5 are fixed to the main body 2 by glue or another assembly material. The heat pipes 5 are inserted on the lower surface 8 of the main body 2 such that the heat pipes 5 are as close to the processor to be cooled and the cold source as possible, and therefore heat exchanges are optimised.

As explained above, the heat exchange zones 3, 4 may be formed directly by parts of the lower surface 8 of the main body 2, or they may be formed using add-on plates 10, 11 in contact with the lower surface 8 of the main body 2.

In this case, the lower surface 8 is machined so as to obtain host locations 27 at the location in which add-on plates 10, 11 will be placed, to give a more robust heat sink, and to choose the distance between the upper surface 9 of the main body 2 and each heat exchange zone. Therefore, the add-on plates 10, 11 are placed in their host location 27 and fixed in these host locations 27, for example by gluing.

Figure 3:
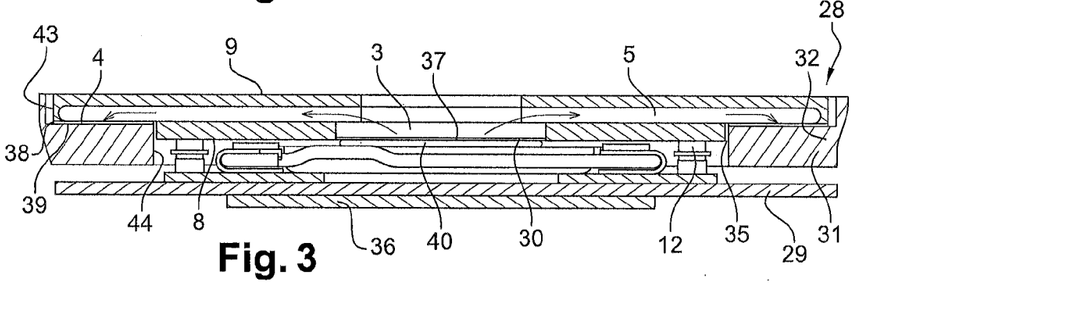
FIG. 3, a sectional view of the heat sink in FIG. 1 when it is integrated into an electronic board.
Figure 5:
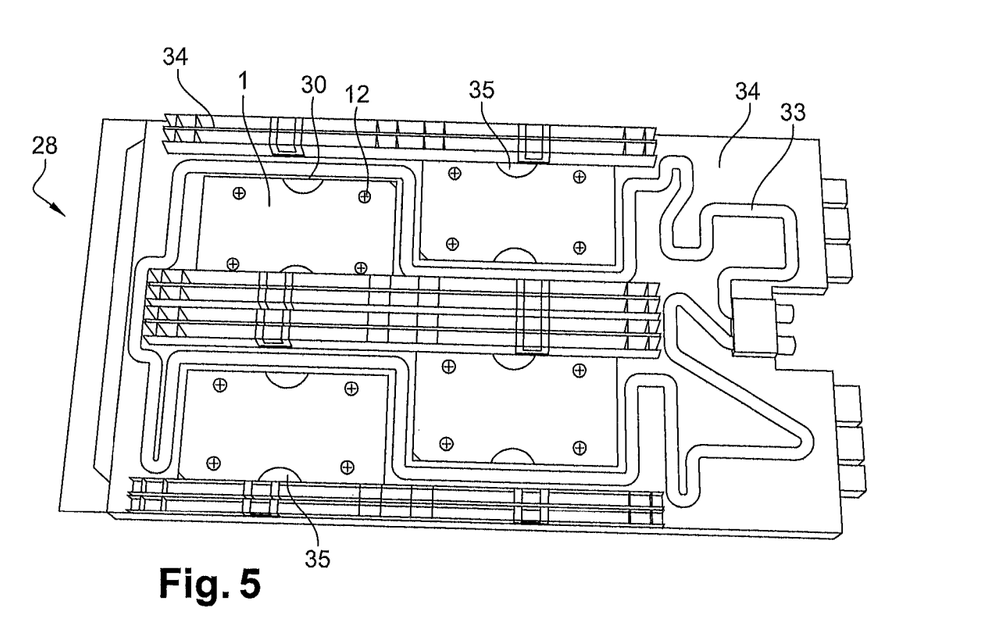
FIG. 5, a top view of an electronic board onto which the heat sink in FIG. 1 is fixed.

An electronic board 28 comprising a heat sink according to an embodiment of the invention will now be disclosed in more detail with reference to FIGS. 3 to 5.

The electronic board 28 comprises a support 29. This support 29 is formed by one or several PCB (printed circuit board) type circuits adjacent to each other. The electronic board 28 also comprises electronic components fixed onto the support 29. Among these electronic components, the electronic board also comprises at least one processor 30. In this case, the electronic board 28 comprises four processors 30 and memory modules 34. Furthermore, the electronic board 28 comprises a cold source 32 for cooling the electronic board. This cold source 32 comprises a cold plate 31. The cold plate 31 is a plate 34 made from a heat conducting material that comprises channels 33 in which a cooling fluid circulates. The cold plate 31 has outside dimensions approximately equal to the outside dimensions of the support 28, such that it covers the entire support 28 and the electronic components that are fixed onto the support, except for:
- Electronic components that are higher than the sum of the distance between the support and the cold plate and the thickness of the cold plate. In this case, this is the case of the processors 30 and the memory modules 34;
- Components that one may need to access, for example for maintenance or in the case of a failure; this is the case for processors 30.

These electronic components that are not covered by the cold plate 31, are subsequently called accessible components.

Therefore the cold plate 31 comprises through openings 35 formed at the accessible components 30, 34 to enable access to accessible components despite the presence of the cold plate 31. This provides access to accessible components 30, 34 without needing to remove the cold plate 31, which can therefore remain fixed on the support. Therefore, the cold plate 31 can efficiently cool the entire electronic board except for accessible components 30, 34.

Therefore additional heat sinks are used to cool accessible components, and particularly heat sinks according to an embodiment of the invention are used in the case of the processors 30. In the case of FIGS. 3 to 5, the heat sinks used to cool the processors are heat sinks like those described above.

Thus with reference to FIG. 3, the heat sink 1 used to cool a processor 30 is fixed onto the support 29 so that:
- The main heat exchange zone 3 is bearing in contact with the processor 30;
- The peripheral heat exchange zones 4 are bearing in contact with the cold plate 31.

The heat sink 1 also applies a force of between 250 and 350 N, for example about 275 N, on the processor so as to force it into contact with the support 28. This force guarantees contact between the processor 30 and its socket interface 36 that is located at the support 29.

The dimensions of the heat sink 1 are larger than the dimensions of the through opening 35 into which the processor 30 cooled by the heat sink is inserted. More precisely, the heat sink 1 is sized such that the peripheral heat exchange zones 4 come into contact bearing on the cold plate 31 when the processor 30 is inserted into the through opening 35 and the main heat exchange zone 3 is bearing on the processor 30.

A thermal interface 37 is inserted between the main heat exchange zone 3 and the processor 30 so as to guarantee contact between the main heat exchange zone 3 and the processor 30. For the same reasons, a thermal interface 38 is inserted between each peripheral heat exchange zone 4 and the cold plate 31.

Each thermal interface 37, 38 is between 0.1 and 0.5 mm thick. The thickness of the thermal interface is sufficient to guarantee contact between the heat exchange zones 3, 4 and the processor 30 and/or the cold plate 31, while being as thin as possible so as to optimise heat exchanges. The material chosen to make the thermal interface is a thermal grease, but "gap pad" type thermal interface pads could also be used depending on the required thermal performances.

Figure 8:
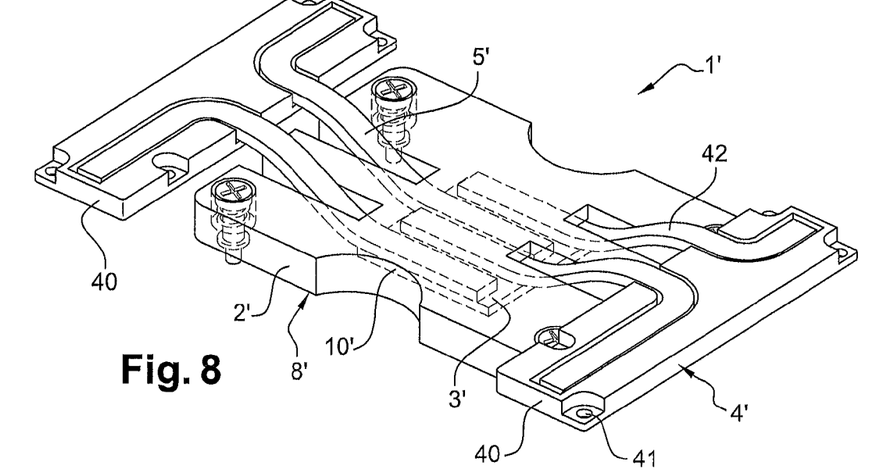
FIG. 8, a perspective view of a heat sink according to another embodiment of the invention.
Figure 9:
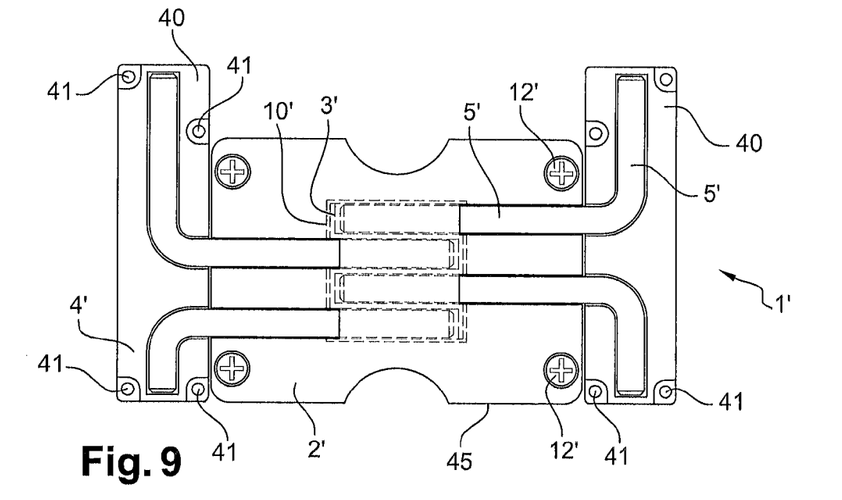
FIG. 9, a top view of the heat sink in FIG. 8.
Figure 10:
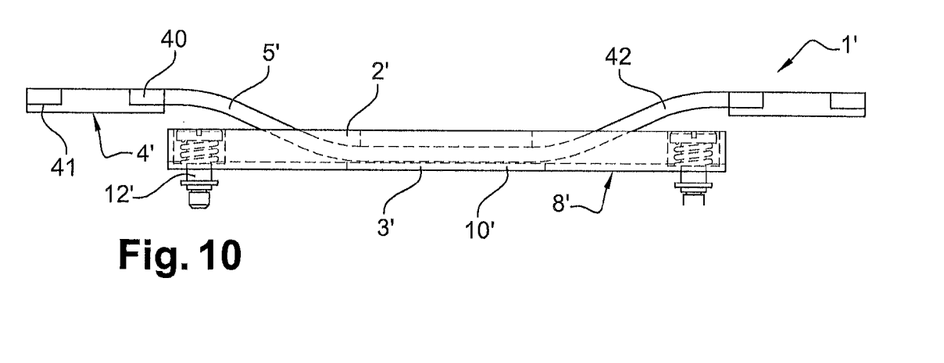
FIG. 10, a side view of the heat sink in FIG. 8.
Figure 11:
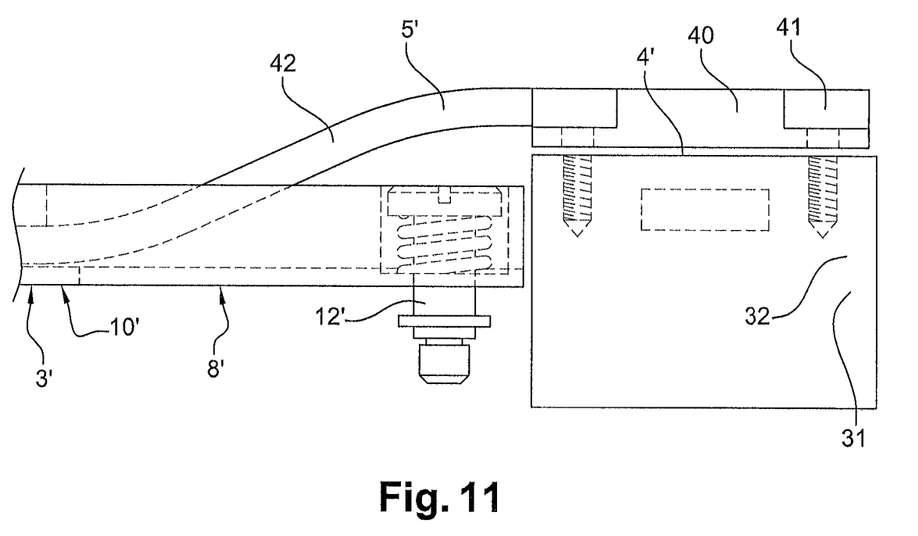
FIG. 11, an enlarged view of a part of the heat sink in FIG. 8, fixed onto a cold source.

FIGS. 8 to 10 show a heat sink 1' according to another embodiment of the invention. This heat sink 1' could also be used to cool the processors 30 of the previously described electronic board.

This heat sink 1' is similar to that described previously, except for the fact that the heat pipes 5' of the heat sink 1' that connect the main heat exchange zone 3' to each peripheral heat exchange zone 4' are flexible such that each peripheral heat exchange zone 4' may be fixed onto a cold source at a variable height relative to the height at which the main heat exchange zone 3' is fixed.

The main body 2, 2' of the heat sink extends along a reference plane 45. In this document, the "height" refers to a dimension along an axis perpendicular to this reference plane 45.

In the previously disclosed embodiment, the peripheral heat exchange zones 4 are fixed onto the main body 2 of the heat sink 1, in the same way as the main heat exchange zone 3 and the heat pipes 5 are integrated into this main body 2 such that the peripheral heat exchange zones 4 are motionless relative to the main heat exchange zone 3. Thus, in the previous embodiment, only the thermal interfaces 38, 39 are capable of compensating for variations in height between the upper surface 39 of the cold source 32 and the upper surface 40 of the processor 30. However, the thermal interfaces can only compensate small height variations. Furthermore, the heat sink 1 is not suitable for all electronic boards: it is only suitable for electronic boards in which the height difference between the upper surface 39 of the cold plate 31 and the upper surface 40 of the processor is approximately equal to the difference in height between each peripheral heat exchange zone and the main heat exchange zone.

The heat sink 1' that has just been described with reference to FIGS. 8 to 10 can overcome these disadvantages. To achieve this, each peripheral heat exchange zone 4' is free to move relative to the main heat exchange zone 3'. Thus, each peripheral heat exchange zone 4' may be fixed on the cold source independently of the attachment of the main heat exchange zone 3' on the processor, which can guarantee good thermal contact between the heat sink and both the cold source and the processor, regardless of the thermal expansion of these different elements.

Therefore in this embodiment, each peripheral heat exchange zone 4' is free to move in height relative to the main heat exchange zone 3'.

To achieve this, the heat sink 1' comprises a main body 2'. The main body 2' has a lower surface 8' on which the main heat exchange zone 3' is located. As before, the main heat exchange zone 3' may be formed either directly by part of the lower surface 8' and part of the heat pipes that pass through it, or by an add-on plate 10' fixed onto the lower surface 8'.

Each peripheral heat exchange zone 4° is located on a peripheral plate 40 that is separate from the main body 2'. Each peripheral heat exchange zone 4' is thermally connected to the main heat exchange zone 3' through two heat pipes 5'. The heat pipes 5' are flexible such that each peripheral heat exchange zone 4' is free to move in height relative to the main heat exchange zone 3'. To achieve this, each heat pipe 5' comprises at least one part 42 that is free between the main body 2' and the peripheral plate 40 to which said heat pipe 5' connects the main body 2'. Moreover, to reduce the risk of breakage of the heat pipes 5', the heat sink 1' comprises four heat pipes 5' instead of only two heat pipes. Thus, the two peripheral heat exchange zones 4' are not connected to the main heat exchange zone 3' by the same heat pipes that pass through the main heat exchange zone, but by different heat pipes.

Therefore each peripheral plate 40 is connected to the main body 2' only through two flexible heat pipes 5', such that each peripheral plate 40 is free to move in height relative to the main body 2'. Moreover, each peripheral plate 40 comprises secondary attachment device (broadly termed "fastener") 41 that are used to fix each peripheral plate 40 onto a cold source 32 independently of the main attachment device 12' that are used to fix the main body 2' on the support 28.

This embodiment can also give peripheral plates 40 that have dimensions different from the dimensions of the main body 2' depending on the available space and so as to optimise the efficiency of the heat sink.

It will be appreciated that the invention is not limited to the embodiments disclosed with reference to the figures and variants could be envisaged without going outside the scope of the invention. Thus, in the embodiment disclosed with reference to FIGS. 8 to 10, the peripheral heat exchange zones were free to move in height only relative to the main heat exchange zone 3', but it would also be possible to envisage peripheral heat exchange zones free to move in other directions relative to the main heat exchange zone. Furthermore, in all the embodiments described above, the peripheral heat exchange zones are parallel to the main heat exchange zone. However, it would also be possible to envisage that peripheral heat exchange zones extend perpendicular to the main heat exchange zone. In this case, the dimensions of the heat sink would be adjusted to match the through opening of the cold plate 31 such that the heat sink can be inserted into the through opening 35. The peripheral heat exchange zones would then be formed by a lateral rim 43 of the heat sink that would come into contact with a lateral rim 44 of the cold plate 31.

The invention claimed is:

1. An electronic board comprising:
a support;
a processor;
a cooling source;
a heat sink including
    a main heat exchange zone bearing in contact with the processor;
    at least one peripheral heat exchange zone in thermal contact with the cooling source,
    at least one heat pipe connecting the main heat exchange zone with the peripheral heat exchange zone, the heat pipe containing a cooling fluid,
wherein the processor is located between the heat sink and the support, the main heat exchange zone bearing the processor, the peripheral heat exchange zone being thermally connected to the cooling source, and
wherein the cooling source is a cold plate extending substantially parallel to the support, the electronic board further comprising electronic components other than the processor, the electronic components being fixed onto the support, the cold plate covering all electronic components fixed onto the support for which the height is less than the sum of:

the distance between the cold plate and the support; and the thickness of the cold plate.

2. The electronic board according to claim 1, wherein the main heat exchange zone comprises a plane bearing surface bearing in contact with the processor, the peripheral heat exchange zone comprising a plane bearing surface bearing in contact with the cooling source.

3. The electronic board according to claim 1, further comprising a main attachment device constructed to fix the heat sink to the support and to control the force applied by the main heat exchange zone on the processor inserted between the main heat exchange zone and the support.

4. The electronic board according to claim 1, wherein the peripheral heat exchange zone is motionless relative to the main heat exchange zone.

5. The electronic board according to claim 1, wherein the peripheral heat exchange zone is free to move relative to the main heat exchange zone, the heat pipe being flexible.

6. The electronic board according to claim 5, further comprising a secondary attachment device fixing the peripheral heat exchange zone onto the cooling source.

7. The electronic board according to claim 1, wherein the main heat exchange zone is thermally connected to the processor through a thermal interface material, the peripheral heat exchange zone being thermally connected to the cooling source through a thermal interface material.

8. The electronic board according to claim 1, wherein the cold plate comprises a through opening, the processor passing through the through opening.

\* \* \* \* \*